United States Patent [19]

Kawajiri et al.

[11] Patent Number: 4,631,407
[45] Date of Patent: Dec. 23, 1986

[54] RADIATION IMAGE INFORMATION READ-OUT SYSTEM

[75] Inventors: Kazuhiro Kawajiri; Hiroshi Sunagawa; Nobuharu Nozaki; Yuichi Hosoi; Kenji Takahashi, all of Kanagawa, Japan

[73] Assignee: Fuji Photo Film Co., Ltd., Kanagawa, Japan

[21] Appl. No.: 673,234

[22] Filed: Nov. 19, 1984

[30] Foreign Application Priority Data

Nov. 21, 1983 [JP] Japan ................................ 58-219314

[51] Int. Cl.[4] ............................................. G03C 5/16
[52] U.S. Cl. .............................. 250/327.2; 250/484.1
[58] Field of Search ........................... 250/327.2, 484.1

[56] References Cited

U.S. PATENT DOCUMENTS 4,302,671 11/1981 Kato et al. ..................... 250/327.2
4,302,672 11/1981 Kato et al. ..................... 250/327.2
4,369,367 1/1983 Horikawa ...................... 250/327.2

Primary Examiner—Janice A. Howell
Attorney, Agent, or Firm—Sughrue, Mion, Zinn, Macpeak, and Seas

[57] ABSTRACT

A radiation image read-out system comprises a point-source light for projecting a spot of stimulating rays onto a stimulable phosphor sheet carrying a radiation image stored therein, and a solid state photoelectric converter which is opposed to the spot-like portion of the stimulable phosphor sheet exposed to the spot of stimulating rays and is adapted to receive light from the spot-like portion. The point-source light and the solid state photoelectric converter are moved with respect to the stimulable phosphor sheet to two-dimensionally scan the stimulable phosphor sheet, thereby reading out the radiation image stored therein.

5 Claims, 4 Drawing Figures

RADIATION IMAGE INFORMATION READ-OUT SYSTEM

BACKGROUND OF THE INVENTION

1. Field of the Invention

This invention relates to a radiation image information read-out system for obtaining image signals from a stimulable phosphor sheet carrying a radiation transmission image stored therein by exposing the stimulable phosphor sheet to stimulating rays and photoelectrically reading light emitted from the stimulable phosphor sheet in proportion to the stored radiation energy upon exposure to the stimulating rays.

2. Description of the Prior Art

In U.S. Pat. No. 3,859,527, there are disclosed a method and a system in which a radiation transmission image of, for instance, a human body is once stored in a stimulable phosphor sheet and the stimulable phosphor sheet is scanned by stimulating rays and light emitted from the stimulable phosphor sheet in proportion to the stored radiation energy is detected by a photo-detector, thereby obtaining image signals for reproducing the radiation trasmission image.

In the system, a half-silvered mirror is positioned at 45° with respect to the stimulable phosphor sheet, and stimulating rays are projected onto the sheet through the half-silvered mirror from behind the mirror. Light emitted from the sheet upon exposure to the stimulating rays is laterally reflected by the half-silvered mirror to impinge upon an image intensifier or a photomultiplier. Alternatively, stimulating rays are projected onto the backside of the stimulable phosphor sheet through an aperture and light emitted from the front side of the same is laterally reflected by a prism to impinge upon an image intensifire. However, this system is disadvantageous in that since the half-silvered mirror or the prism is substantially spaced from the stimulable phosphor sheet, light emitted from the stimulable phosphor sheet upon exposure to the stimulating rays, which is weak and nondirectional, cannot be efficiently accumulated.

In the system disclosed in U.S. Pat. No. 4,302,671, a photo-detector is disposed in close proximity of the stimulable phosphor sheet and a small reflecting optical device is disposed between the photo-detector and the phosphor sheet so that stimulating rays traveling through the space between the photo-detector and the phosphor sheet are reflected by the reflecting optical device to impinge upon the phosphor sheet. Though this system is advantageous in that the receiving solid angle of the photo-detector can be enlarged whereby S/N ratio can be improved, there is required a complicated and precise optical device in order to cause the stimulating rays to travel through the space between the photo-detector and the phosphor sheet and to impinge upon the small reflecting optical device.

In Japanese Unexmined Patent Publication 58(1983)-121874, there is disclosed an X-ray image converter comprising a stimulable phosphor sheet and a photo-sensor utilizing a photoconductive semiconductor. The photosensor comprises a photoconductive semiconductor sandwiched between a pair of transparent electrodes and is laminated on the stimulable phosphor sheet over the entire area thereof. The transparent electrodes may be divided into a plurality of parallel strips. In this X-ray image converter, the radiation transmission image stored in the stimulable phosphor sheet is read out by scanning the phosphor sheet by stimulating rays through the transparent electrodes, or by providing an array of LEDs over the entire surface of the photo-sensor and successively energizing the LEDs to scan the phosphor sheet. This system may be considered to be advantageous in that the S/N ratio can be improved since the photo-sensor is immediately superposed on the stimulable phosphor sheet and therefore there should be less loss of the light emitted from the phosphor sheet, between the phosphor sheet and the photo-sensor.

However, in fact the X-ray image converter suffers from the following drawbacks.

Since the photo-sensor is superposed on the stimulable phosphor sheet over the entire surface thereof, the photoconductive semiconductor of the photo-sensor, which has low resistance to intense light, is apt to be deteriorated by the noise erasure operation (Pertaining to removal of the remaining radiation energy stored in the stimulable phosphor sheet after completion of read-out of a radiation trasmission image, and generally accomplished by exposure to a large amount of light having wavelengths in the stimulating spectrum. This operation is required since the residual radiation energy constitutes noise in the next read-out of image information.), and the stimulable phosphor sheet becomes heavy and cumbersome. Further, it is very difficult to realize a stimulable phosphor sheet bearing thereon such a photosensor and/or an array of LEDs over the entire surface thereof, and such an arrangement would be very costly. Further since the area of the transparent electrodes is very large even if they are divided into parallel strips, excessive dark current will be inherently generated. Due to the excessive dark current and a large capacitance, the S/N ratio cannot be appreciably improved.

SUMMARY OF THE INVENTION

In view of the foregoing observations and description, the primary object of the present invention is to provide a radiation image information read-out system which is easy to handle, and can be easily manufactured at low cost, and in which the S/N ratio is high and the noise erasure operation can be easily accomplished.

The radiation information image read-out system in accordance with the present invention comprises a point-source light for projecting a spot of stimulating rays onto a stimulable phosphor sheet carrying a radiation image stored therein, and a solid state photoelectric converter which is opposed to the spot-like portion of the stimulable phosphor sheet exposed to the spot of stimulating rays and is adapted to receive light from the spot-like portion. The point-source light and the solid state photoelectric converter are moved with respect to the stimulable phosphor sheet to two-dimensionally scan the stimulable phosphor sheet, thereby reading out the radiation image stored therein.

That is, in the radiation image information read-out system of the present invention, light emitted from the phosphor sheet is read out in a point-to-point manner by scanning the phosphor sheet by a spot of stimulating rays and moving a solid state photoelectric converter in response to the spot of the stimulating rays to always receive light emitted from the spot-like portion of the sheet exposed to the spot of the stimulating rays.

The solid state photoelectric converter may comprise, for instance, a transparent substrate on which a light shielding layer having a transparent window of a size corresponding to the size of a picture element, a first transparent electrode layer, a photoconductive layer having a band gap not larger than the energy of radiation having the wavelength of the light emitted from the stimulable phosphor sheet upon exposure to stimulating rays and a second transparent electrode layer are laminated in this order.

The solid state photoelectric converter should be one having an energy gap (the width of the forbidden energy band in the case of an intrinsic semiconductor and the width between the impurity bound level and the conductive band in the case of an impurity semiconductor) smaller than the energy hv of the light emitted from the stimulable phosphor sheet upon exposure to the stimulating rays, since electrons must be moved to the conductive band from the filled band (in the case of an intrinsic semiconductor) or the impurity bound level (in the case of an impurity semiconductor) upon receipt of the energy hv of the light emitted from the stimulable phosphor sheet upon exposure to the stimulating rays.

In order to move the point-source light and the solid state photoelectric converter with respect to the stimulable phosphor sheet, the former may be moved with the latter being fixed, or the latter may be moved with the former being fixed. Further, it is possible to accomplish the main-scan by moving the phosphor sheet with the point-source light and the photoelectric converter being fixed and to accomplish the sub-scan by moving the point-source light and the photoelectric converter with the phosphor sheet being fixed. For example, in one embodiment of the present invention, the stimulable phosphor sheet is fixed to a rotary drum and the rotary drum is rotated at a high speed to accomplish the main-scan, and the point-source light and the solid state photoelectric converter are moved in the axial direction of the rotary drum to accomplish the sub-scan.

DESCRIPTION OF THE PREFERRED EMBODIMENT

Figure 1:
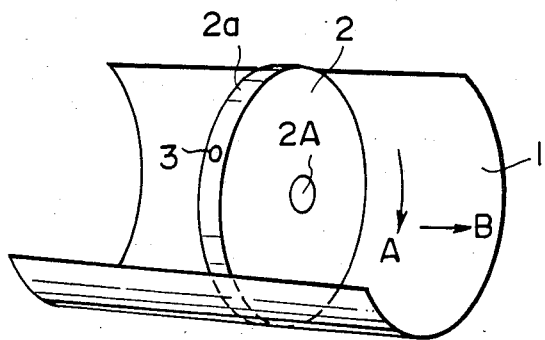
FIG. 1 is a schematic perspective view showing a basic arrangement of a radiation information image read-out system in accordance with an embodiment of the present invention.

FIG. 1 is a schematic perspective view showing a basic arrangement of a radiation image information read-out system in accordance with an embodiment of the present invention. In this embodiment, a stimulable phosphor sheet 1 is curled into a semicylindrical shape and is fixed in this condition. A disk-like rotary member 2 having a peripheral surface 2a is disposed on the inner side of the semicylindrical stimulable phosphor sheet 1 to rotate along the inner surface of the phosphor sheet 1. A stimulating-reading section 3 comprising a point-source light and a solid state photoelectric converter arranged integrally with each other is fixed on the peripheral surface 2a of the disk-like rotary member 2. The rotary member 2 is rotated at a high speed in the direction of the arrow A to accomplish the main-scan and is moved in the direction of its rotational axis 2A (the direction of the arrow B) to accomplish the sub-scan.

In the embodiment shown in FIG. 1, the sub-scan may be accomplished by moving the stimulable phosphor sheet 1 in the direction of the arrow B instead of moving the rotary member 2.

Figure 2:
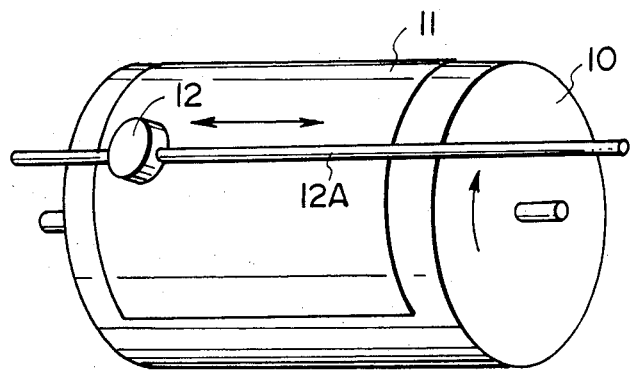
FIG. 2 is a schematic perspective view of a radiation image information read-out system in accordance with another embodiment of the present invention.

In another embodiment of the present invention shown in FIG. 2, the phosphor sheet is fixed on a rotary drum and the point-source light and the solid state photoelectric converter are held in proximity to the outer surface of the rotary drum.

In FIG. 2, a stimulable phosphor sheet 11 is fixed on a rotary drum 10 and a stimulating-reading section 12 having a point-source light and a solid state photoelectric converter is disposed to be movable along the outer surface of the rotary drum 10 in the axial direction of the drum 10. More specifically, a guide rail 12A is disposed along the outer surface of the rotary drum 10 to extend in the axial direction of the drum 10 and the stimulating-reading section 12 is mounted on the guide rail 12A to be slid along the guide rail 12A driven by, for instance, a linear motor (not shown).

Figures 3, 4:
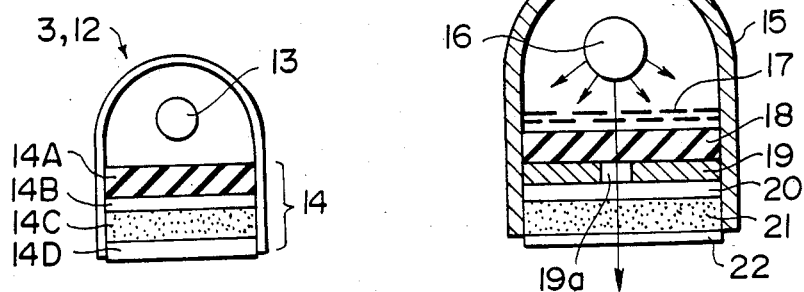
FIG. 3 is a schematic view illustrating an example of the stimulating-reading section which can be employed in the system shown in FIGS. 1 or 2.
FIG. 4 is a schematic view illustrating another example of the stimulating-reading section.

FIGS. 3 and 4 respectively show examples of the stimulating-reading section (3 or 12).

The example of the stimulating-reading section shown in FIG. 3 comprises a point-source light 13 and a solid state photoelectric converter 14 accommodated in a casing. The solid state photoelectric converter layer 14 comprises a first electrode layer 14B, a photo-conductive layer 14C and a second electrode layer 14D stacked on a trans-parent substrate 14A.

The example of the stimulating-reading section shown in FIG. 4 comprises a point-source light 16 disposed in a casing 15 and a solid state photoelectric converter disposed below the point-source light 16. The photoelectric converter comprises a light shielding layer 19 provided with a transparent window 19a of a size corresponding to the size of a picture element, a first transparent electrode layer 20, a photoconductive material layer 21 having a band gap not larger than the energy of radiation having the wavelength of the light emitted from the stimulable phosphor sheet upon exposure to the stimulating rays, and a second trasparent electrode layer 22 stacked on a transparent substrate 18 in this order. A shortwave cut filter 17 is disposed between the point-source light 16 and the transparent substrate 18.

Of the light emitted from the point-source light 13 or 16, the downwardly directed light (the light passing through the transparent window 19a of the light shielding layer 19 in the case of the example shown in FIG. 4) is projected onto the stimulable phosphor sheet 1 or 11 as a spot of the stimulating rays. The spot-like portion of the stimulable phosphor sheet 1 or 11 exposed to the stimulating ray spot emits light in proportion to the stored radiation energy. The light emitted from the spot-like portion impinges upon the photoconductive layer (14C, 21) through the second electrode (14D, 22) to produce photo-carriers in the photoconductive layer, thereby generating a potential difference between the first electrode (14B, 20) and the second electrode (14D, 22) in proportion to the amount of the produced photo-carriers. The radiation image information stored in the spot-like portion of the phosphor sheet can be read out by reading out the potential difference.

In the example shown in FIG. 4, the S/N ratio can be increased by using the light shielding layer 19 having the transparent window 19a to enlarge the effective light receiving area of the photoconductive layer 21. In this regard, the example shown in FIG. 4 is advantageous over that shown in FIG. 3.

The shortwave cut filter 17 is for cutting the shortwave components of the light emitted from the point-source light 16 in order to spectrally divide the light emitted from the stimulable phosphor sheet from the stimulating rays in case that the light emitted from the point-source light 16 includes shortwave components.

Though in the embodiments described above, only one stimulating-reading section is provided for one stimulable phosphor sheet, a plurality of stimulating-reading sections may be provided spaced from each other, thereby reducing the time required to read out the radiation image stored in the stimulable phosphor sheet.

Further, a light guide member comprising an optical fiber or optical fibers may be provided between the phosphor sheet and the stimulating-reading section to guide light therebetween.

As can be understood from the description above, the light receiving solid angle can be enlarged in accordance with the present invention thereby improving the S/N ratio since there is no need for reflecting means such as a half-silvered mirror or a prism, and since the solid state photoelectric converter is of a size corresponding to one picture element and accordingly only a small dark current is generated and the capacitance is small, the S/N ratio is further improved. Further, since the stimulating-reading section is separated from the stimulable phosphor sheet, the phosphor sheet is easy to handle and the noise erasure operation can be accomplished without the danger of deteriorating the photodetector. Furthermore, since the photo-sensor and the light source employed in the system of the present invention are very small as compared with those employed in the system disclosed in Japanese Unexamined Patent Publication 58(1983)-121874 discussed above, the system of the present invention can be easily manufactured at low cost.

We claim:

1. A radiation image information read-out system comprising point-source light for projecting a spot of stimulating rays onto a stimulable phosphor sheet carrying a radiation image stored therein, a solid state photoelectric converter which is opposed to the spot-like portion of the stimulable phosphor sheet exposed to the spot of stimulating rays and is adapted to receive light emitted from the spot-like portion to convert it into an electric signal, and driving means for simultaneously moving the point-source light associated with the solid state photoelectric converter and the solid state photoelectric converter with respect to the stimulable phosphor sheet to scan the same.

2. A radiation image information read-out system as defined in claim 1, further comprising a head unit casing enclosing and integral with said point-source light and said solid state photoelectric converter and wherein said driving means moves said head unit casing.

3. A radiation image information read-out system as defined in claim 1 in which said solid state photoelectric converter comprises a first layer having a transparent window of a size corresponding to the size of a picture element, a first transparent electrode layer, a photoconductive material layer having a band gap not larger than the energy of radiation having the wavelength of the light emitted from the stimulable phosphor sheet upon exposure to the spot of stimulating rays, and a second transparent electrode layer stacked on a transparent substrate in this order, and is formed integrally with said point-source light disposed behind the transparent substrate.

4. A radiation image information read-out system as defined in claim 3, wherein said transparent window has the same lateral extent as said photoconductive material layer.

5. A radiation image information read-out system as defined in claim 3, wherein said first layer is a light shielding layer except for said transparent window being an aperture located centrally in said first layer and said window being smaller in lateral extent than said photoconductive material layer.

* * * * *